United States Patent
Honda et al.

(10) Patent No.: US 7,948,321 B2
(45) Date of Patent: *May 24, 2011

(54) FET BIAS CIRCUIT

(75) Inventors: Tamaki Honda, Mitaka (JP); Hironori Sakamoto, Mitaka (JP); Kenjiro Okadome, Mitaka (JP)

(73) Assignee: Japan Radio Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/684,251

(22) Filed: Jan. 8, 2010

(65) Prior Publication Data

US 2010/0109782 A1    May 6, 2010

Related U.S. Application Data

(62) Division of application No. 11/994,702, filed as application No. PCT/JP2006/313404 on Jul. 5, 2006, now Pat. No. 7,671,684.

(30) Foreign Application Priority Data

Jul. 5, 2005    (JP) .................................. 2005-196492

(51) Int. Cl.
    *H03F 3/04*    (2006.01)
(52) U.S. Cl. ........................................ 330/296; 330/277
(58) Field of Classification Search ................. 330/296, 330/277, 285, 290, 289
    See application file for complete search history.

(56) References Cited

U.S. PATENT DOCUMENTS

| 6,255,910 | B1 |   | 7/2001  | Forstner |         |
|-----------|----|---|---------|----------|---------|
| 7,190,935 | B2 |   | 3/2007  | Hecht    |         |
| 7,202,743 | B2 |   | 4/2007  | Enomoto  |         |
| 7,286,019 | B2 | * | 10/2007 | Peng et al. | 330/311 |

FOREIGN PATENT DOCUMENTS

| JP | 6-164255 A   | 6/1994  |
| JP | 9-284062 A   | 10/1997 |
| JP | 2001-284974 A | 10/2001 |
| JP | 2002-519882 A | 7/2002  |
| JP | 2003-198294 A | 7/2003  |
| JP | 2005-123861 A | 5/2005  |

OTHER PUBLICATIONS

Written Opinion of the International Searching Authority for International Application No. PCT/JP2006/313404 with English translation.
International Search Report for International Application No. PCT/JP2006/313404 mailed Oct. 10, 2006 with English translation.
Japanese Office Action for Japanese Patent application No. 2005-196492 mailed Dec. 4, 2007 with English translation.
Notice of Grounds for Rejection for Patent Application Serial No. 2005-196492 mailed Aug. 14, 2007 with English translation.

* cited by examiner

*Primary Examiner* — Hieu P Nguyen
(74) *Attorney, Agent, or Firm* — Cantor Colburn LLP

(57) ABSTRACT

A FET bias circuit applies a bias voltage that is not adjusted separately to an amplifying element FET of a FET amplifying circuit. In the FET bias circuit is provided a monitor element FET m having a gate connected to the gate of the amplifying element FET a and a source connected to the source of the amplifying element FET a, respectively, and having a drain current with respect to the bias voltage substantially proportional to the drain current of the amplifying element FET a. In the FET bias circuit is further provided a fixed bias circuit for applying the bias voltage so that the amplifying element FET a enters a predetermined operating class by applying a bias voltage to the monitor element FET m so that a drain current flowing to the monitor element FET m enters a predetermined operating class.

4 Claims, 2 Drawing Sheets

FET BIAS CIRCUIT

CROSS REFERENCE

The present application is a divisional application of U.S. patent application Ser. No. 11/994,702, filed Jan. 4, 2008 (issued as U.S. Pat. No. 7,671,684 on Mar. 2, 2010), the entire contents of which are incorporated herein by reference and priority to which is hereby claimed. Application Ser. No. 11/994,702 is a U.S. National Stage Application of International Application PCT/JP2006/313404 filed Jul. 5, 2006, priority to which is claimed herein and the contents of which are incorporated herein by reference. The PCT/JP2006/313404 application claimed the benefit of the date of the earlier filed Japanese Patent Application Nos. JP2005-196492 filed Jul. 5, 2005 (now registered as JP Patent Registration No. 4102815), the entire contents of which are incorporated herein by reference, and priority which is hereby claimed.

TECHNICAL FIELD

The present invention relates to a FET bias circuit wherein a bias voltage for a predetermined operating class is applied to an amplifying element FET for amplifying an input high frequency signal.

BACKGROUND ART

An amplifying circuit for amplifying high frequency signals is used in radio communications equipment. Furthermore, a FET (field effect transistor) can be used for the amplifying element. FIG. 2 shows a conventional FET amplifying circuit 20 as an example. A GaAs FET is for an amplifying element FET a shown in FIG. 2. The amplifying element FET a shown in FIG. 2 has a gate connected to voltage dividing resistor Rg3 via a negative supply (−Vg), a drain connected to an inductor L2 via a positive supply (+Vd), and a grounded source. A bias voltage Vgs1 is applied across the gate and source so that a drain current Ids1 flows to place the amplifying element FET a into a predetermined operating class (for example, class AB). The amplifying element FET a, which has been placed in a predetermined operating class by being applied with the bias voltage Vgs1 in this manner, amplifies a high frequency signal that has been input by an input terminal IN via a capacitor C1 and outputs an amplified high frequency signal from an output terminal OUT via a capacitor C2.

Variations in the characteristics of semiconductor devices, such as the amplifying element FET a, can be found within individual devices, as well as among multiple devices. In an example of the former, the amplifying element FET a exhibits variations in the characteristic of the drain current Ids1 with respect to the bias voltage Vgs1 and in the change in the drain current Ids1 with respect to temperature change, while, in an example of the latter, similar variations in characteristic often occur among FETs from different production lots.

To account for production variations, the voltage divider resistor Rg3 (bias circuit) in the bias circuit of a conventional FET amplifying circuit 20, to which is applied the bias voltage Vgs1, is normally adjusted prior to shipment to conform to a predetermined operating class (for example, class AB). However, to compensate for changes in the drain current Ids1 due to temperature changes, it is still necessary to provide a temperature sensitive element, such as a thermistor, at a suitable location on the voltage divider resistor Rg3 and to adjust the temperature sensitive element in accordance with the characteristic of the individual amplifying element FET a, so that the bias voltage Vgs1 will adjust to the changes in the drain current Ids1.

With respect to this issue, it is desirable to detect the drain current Ids1 of the amplifying element FET a and control the bias voltage Vgs1 to place the circuit in a predetermined operating class. However, since the amount of the drain current Ids1 varies in accordance with the input of the high frequency signal in an operating class, such as class AB, detecting the drain current Ids1 of the amplifying element FET a to maintain the bias voltage Vgs1 at a predetermined operating class is difficult.

It is an object of the present invention to realize a FET bias circuit for applying the bias voltage for a predetermined operating class to the amplifying element FET a of the FET amplifying circuit.

DISCLOSURE OF INVENTION

The present invention provides a FET bias circuit for applying a bias voltage for a predetermined operating class across a gate and a source of an amplifying element FET for amplifying an input high frequency signal, where the FET bias circuit includes a monitor element FET having a gate connected to the gate of the amplifying element FET and a source connected to the source of the amplifying element FET, respectively, and having a drain current with respect to the bias voltage substantially proportional to the drain current of the amplifying element FET, and a fixed bias circuit for applying the bias voltage so that the amplifying element FET enters a predetermined operating class by applying a bias voltage to the monitor element FET so that a drain current flowing to the monitor element FET enters a predetermined operating class.

It is in some cases additionally preferable for the fixed bias circuit to apply the bias voltage such that the amplifying element FET enters a predetermined operating class by applying a bias voltage to the monitor element FET in accordance with a detected voltage from the drain current of the monitor element FET and a reference voltage, which is a predetermined direct current voltage.

Furthermore, it may also be preferable for the fixed bias circuit to include a first transistor having the detected voltage applied to a base, and a second transistor having the reference voltage applied to a base and an emitter voltage of the first transistor applied to an emitter and for outputting a collector current from a collector in accordance with a base-emitter voltage, wherein a bias voltage is applied to the monitor element FET in accordance with the collector current so that the bias voltage is applied for placing the amplifying element FET into a predetermined operating class.

Still further, it may be preferable for the monitor element FET to be thermally bonded and contained in an integrated circuit together with the amplifying element FET so that the drain current follows any change in the drain current of the amplifying element FET due to temperature changes.

MODE FOR CARRYING OUT THE INVENTION

Figure 1:
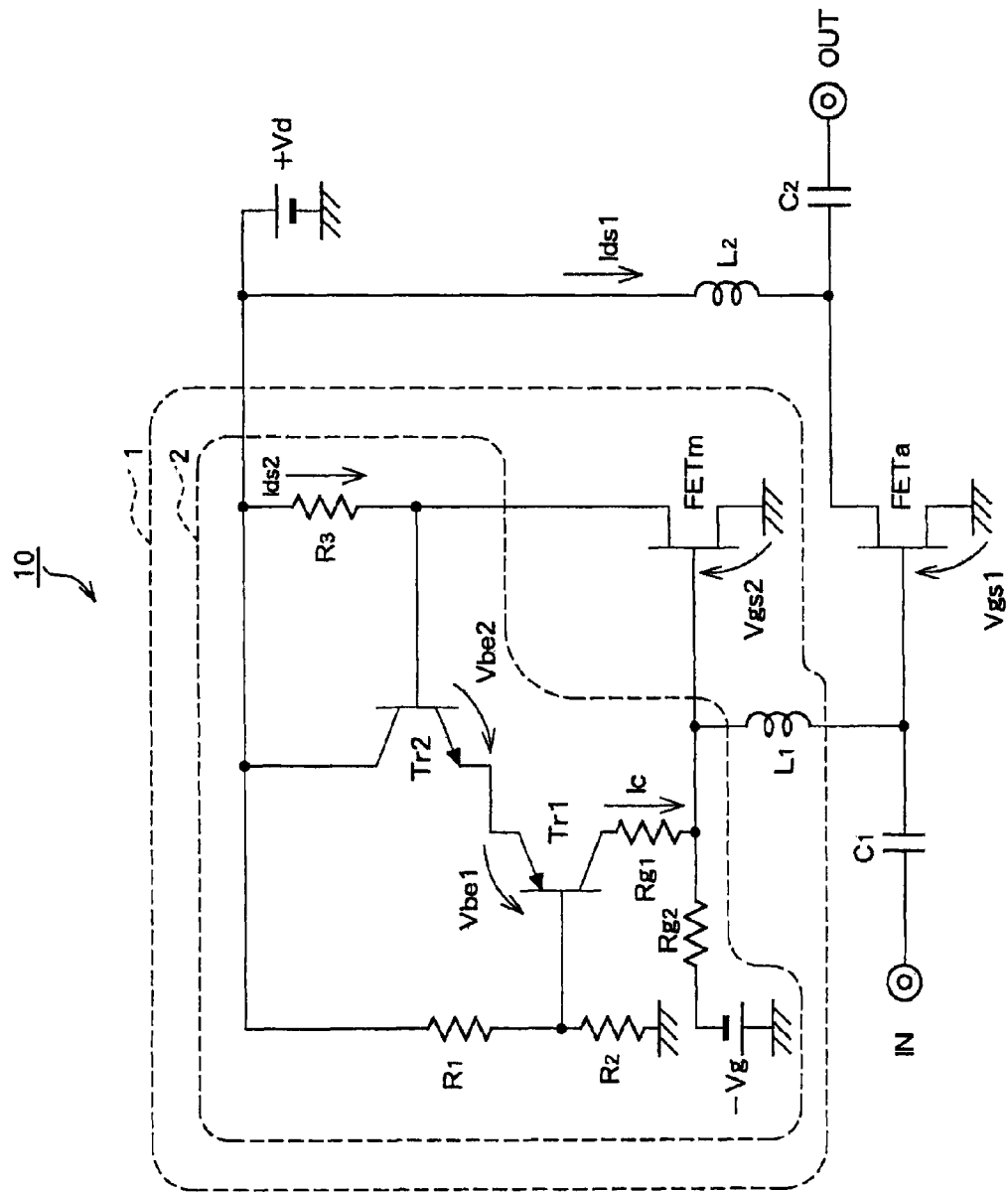
FIG. 1 is a circuit diagram showing a FET amplifying circuit that uses a FET bias circuit relating to an embodiment of the present invention.
Figure 2:
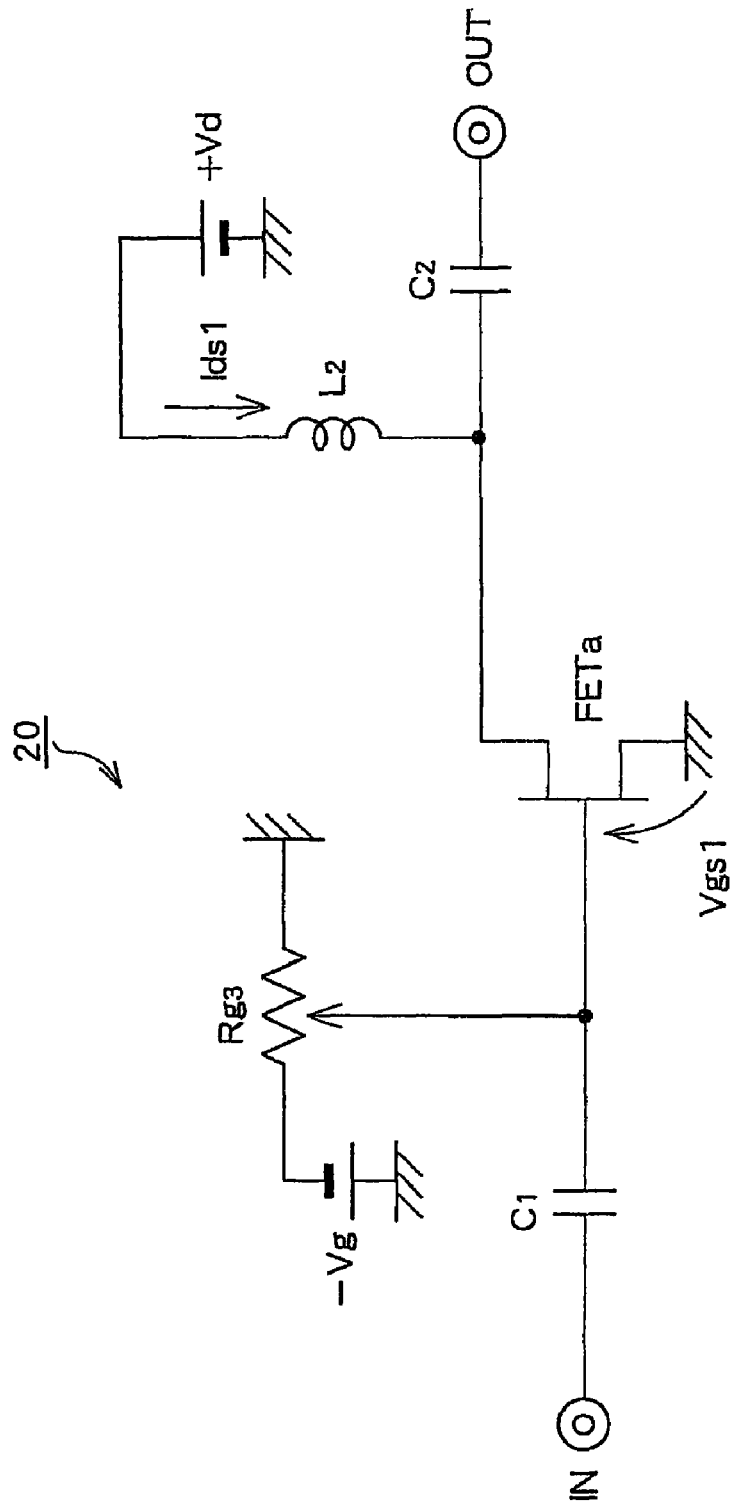
FIG. 2 is a circuit diagram showing a FET amplifying circuit that uses a conventional FET bias circuit.

A FET bias circuit relating to the embodiment will be described hereinafter with reference to the attached drawings. FIG. 1 is a circuit diagram showing a configuration of a FET amplifying circuit 10 that uses a FET bias circuit 1 relating to the embodiment. The FET bias circuit 1 relating to the embodiment applies a bias voltage so that the amplifying element FET a enters an operating class of class AB. First, the configuration of the FET amplifying circuit 10 that uses the FET bias circuit 1 relating to the embodiment of the present invention will be described in detail. Components corresponding to those shown in FIG. 2 are designated with the same reference numerals, and their descriptions will not be repeated.

The FET bias circuit 1 shown in FIG. 1 has a monitor element FET m for monitoring the drain current Ids1 of the amplifying element FET a, a fixed bias circuit 2 for applying the bias voltage Vgs1 to the amplifying element FET a in accordance with the monitored result of the monitor element FET m, and an inductor L1. The configuration of the monitor element FET m and the fixed bias circuit 2 will be described in detail hereinafter.

The monitor element FET m has a gate connected to the gate of the amplifying element FET a via the inductor L1, a source connected to ground in the same manner as the source of the amplifying element FET a, and a drain connected to a positive supply (+Vd) via a resistor R3. Thus, the bias voltage Vgs2 that is applied between the gate and source of the monitor element FET m and the bias voltage Vgs1 that is applied between the gate and source of the amplifying element FET a have the same voltage (namely, Vgs1=Vgs2). The inductor L1 is a high frequency choke coil so that the high frequency signal that is supplied to the amplifying element FET a from the input terminal IN is not supplied to the gate of the monitor element FET m. As a result, the monitor element FET m does not have a variation in the amount of the drain current Ids2 even if a high frequency signal is supplied to the amplifying element FET a from the input terminal IN.

As described hereinabove, the monitor element FET m, like the amplifying element FET a, is a GaAs FET. The monitor element FET m is a FET wherein the drain current Ids2 with respect to the bias voltage Vgs2 is substantially proportional with respect to the drain current Ids1 of the amplifying element FET a. (Namely, Ids1=αIds2 with a being a proportional constant. Furthermore, "substantially proportional" indicates a substantially proportional relationship wherein the respective drain currents rarely have a perfectly proportional relationship since the amplifying element FET a and the monitor element FET m are semiconductor devices.)

Therefore, when the bias voltage Vgs1 is applied across the gate and source of the amplifying element FET a, the same bias current Vgs2 (=Vgs1) is applied across the gate and source of the monitor element FET m causing to flow the drain current Ids2 (=αIds2), which is substantially proportional to the drain current Ids1 flowing to the amplifying element FET a. As a result, the monitor element FET m can monitor (the current substantially proportional to) the drain current Ids1 flowing to the amplifying element FET a.

Furthermore, the monitor element FET m is thermally bonded and contained in the same integrated circuit (IC) package with the amplifying element FET a so that the drain current Ids2 follows the change in the drain current Ids1 of the amplifying element FET a due to temperature changes. Variations in the FET characteristics are liable to occur among FETs in different production lots as described above. Thus, it is preferable for the monitor element FET m to be produced in the same lot as the amplifying element FET a. For example, it is preferable to form the amplifying element FET a and the monitor element FET m on the same chip and house them in the same integrated circuit (IC) package. As a result, the monitor element FET m can monitor the drain current Ids1 of the amplifying element FET a more accurately.

Next, the configuration of the fixed bias circuit 2 will be described. As described above, the fixed bias circuit 2 applies the bias voltage Vgs1 to the amplifying element FET a in accordance with the monitored result of the monitor element FET m. A resistor R3 is a resistor for detecting a voltage (=Ids2×R3) in accordance with the drain current Ids2 flowing to the monitor element FET m as described above and is connected to the drain of the monitor element FET m and the positive supply (+Vd). A resistor R1 and a resistor R2 divide the voltage (+Vd) from the positive supply to generate a reference voltage Vs (=Vd×R1/(R1+R2)), which is a fixed voltage value, and are connected in series from the positive supply (+Vd) to GND. The fixed bias circuit 2 to be described hereinafter controls the bias voltage Vgs1 of the amplifying element FET a in accordance with the detected voltage Ids2×R3 at the resistor R3 and the reference voltage Vs that is generated from the resistor R1 and the resistor R2.

Transistors Tr1 and Tr2 control the bias voltage Vgs1 that is applied to the amplifying element FET a by causing a collector current IC to flow in accordance with the aforementioned detected voltage Ids2×R3 and the reference voltage Vs. Furthermore, the transistor Tr1 has a base connected to the resistors R1 and R2, and a collector connected to the gates of the monitor element FET m and the amplifying element FET a via the resistor Rg1. The transistor Tr2 has a base connected to the resistor R3 and the drain of the monitor element FET m, a collector connected to the positive supply (+Vd), and an emitter connected to the emitter of the transistor Tr1. The resistors Rg1 and Rg2 are for applying the bias voltage Vgs1 to the amplifying element FET a in accordance with the aforementioned collector current IC. This configuration enables the FET bias circuit 1 relating to the embodiment to apply a bias voltage to place the amplifying element FET a into a predetermined operating class.

An operation of the FET bias circuit 1 relating to the embodiment will be described hereinafter. A voltage is applied to the drain of the amplifying element FET a (and monitor element FET m) from the positive supply (+Vd) and a bias voltage Vgs1 is applied across the gate and source of the amplifying element FET a from the negative supply (−Vg) via the resistor Rg2 and the inductor L1. As a result, the drain current Ids1 flows to the amplifying element FET a so that the amplifying element FET a enters class AB operation. As described above, the drain current Ids2, which is proportional to the drain current Ids1 of the amplifying element FET a, flows to the monitor element FET m. Thus, the drain current Ids2 flows so that the monitor element FET m also enters class AB operation similar to the amplifying element FET a. As described above, the amplifying element FET a amplifies the high frequency signal, which is input from the input terminal IN via the capacitor C1 and outputs the amplified high frequency signal from the drain via the capacitor C2 to the output terminal OUT.

Next, an operation of the fixed bias circuit 2 will be described. As described above, the voltage Ids2×R3 is applied to the resistor R3 in accordance with the drain current Ids2 of the monitor element FET m. Furthermore, the reference voltage Vs, which is a fixed voltage value as described above, is applied to the resistor R1. Thus, with the base-emitter voltage of the transistors Tr1 and Tr2 designated as Vbe1 and Vbe2:

$$Vs(\text{fixed}) = Vbe1 + Vbe2 + Ids2 \times R3 \quad (1)$$

Therefore, when the drain current Ids2 of the monitor element FET m increases, the base-emitter voltages Vbe1 and Vbe2 of the transistors Tr1 and Tr2 decrease. Conversely, the drain current Ids2 decreases, the base-emitter voltages Vbe1 and Vbe2 increase.

Furthermore, when the collector current Ic flows in accordance with the aforementioned base-emitter voltages Vbe1 and Vbe2 from the transistors Tr1 and Tr2, the bias voltages Vgs1 and Vgs2 of the amplifying element FET a and the monitor element FET m become:

$$Vgs1 = Vgs2 = -Vg + Ic \times Rg2 \quad (2)$$

The transistors Tr1 and Tr2 have an increase in the collector current Ic as the base-emitter voltages Vbe1 and Vbe2 increase. Thus, the bias voltages Vgs1 and Vgs2 of the amplifying element FET a and the monitor element FET m increase as the base-emitter voltages Vbe1 and Vbe2 of the transistors Tr1 and Tr2 increase.

Therefore, when the drain current Ids1 of the amplifying element FET a decreases (due to a temperature change, for example), the drain current Ids2 of the monitor element FET m having a proportional relationship also decreases. Furthermore, as a result, the base-emitter voltages (Vbe1+Vbe2) of the transistors Tr1 and Tr2 increase and the collector current Ic increases due to the transistors Tr1 and Tr2. Moreover, due to the increase in the collector current Ic of the transistors Tr1 and Tr2, the bias voltage Vgs2 of the monitor element FET m increases and the drain current Ids2 of the monitor element FET m increases. As a result, the drain current Ids1 of the amplifying element FET a having a proportional relationship with the drain current Ids2 of the monitor element FET m also increases. Therefore, the fixed bias circuit 2 can operate so that the drain current Ids1 is increased when the drain current Ids1 of the amplifying element FET a decreases.

Furthermore, in contrast to the above-described example, when the drain current Ids1 of the amplifying element FET a increases, the base-emitter voltage (Vbe1+Vbe2) of the transistors Tr1 and Tr2 decreases, the collector current Ic decreases, and the bias voltages Vgs1 and Vgs2 of the amplifying element FET a and the monitor element FET m decrease so that the drain currents Ids1 and Ids2 of the amplifying element FET a and the monitor element FET m, respectively, can be decreased. Therefore, the fixed bias circuit can control the drain current Ids1 so as to be fixed by controlling the bias voltage in accordance with the increase or decrease of the drain current Ids1 of the amplifying element FET a.

As described above, the FET bias circuit indicated in the embodiment can apply a bias voltage that is not adjusted separately to the amplifying element FET a of the FET amplifying circuit. Although a configuration based on the transistors Tr1 and Tr2 was described as the fixed bias circuit in the embodiment, an arithmetic circuit of op amps may be configured. Furthermore, although the embodiment was described with GaAs FETs, other types of FETs, such as LDMOSFETs or GaN FETs, may also be applicable.

What is claimed is:

1. A FET bias circuit for applying a bias voltage across a gate and a source of an amplifying element FET for amplifying an input high frequency signal, the FET bias circuit comprising:
    a monitor element FET having a gate connected to the gate of the amplifying element FET and a source connected to the source of the amplifying element FET, respectively, and having a drain current with respect to the bias voltage substantially proportional to the drain current of the amplifying element FET; and
    a fixed bias circuit for applying the bias voltage so that the amplifying element FET enters a predetermined operating class by applying a bias voltage to the monitor element FET so that a drain current flowing to the monitor element FET enters a predetermined operating class;
    wherein said fixed bias circuit comprises:
        a first transistor having said detected voltage applied to a base; and
        a second transistor having said reference voltage applied to a base and an emitter voltage of said first transistor applied to an emitter and for outputting a collector current from a collector in accordance with a base-emitter voltage;
    wherein a bias voltage is applied to the monitor element FET in accordance with said collector current so that the bias voltage is applied for placing the amplifying element FET into a predetermined operating class;
    wherein said monitor element FET is a GaAs FET produced in a same lot as the amplifying element FET, and the drain current of said monitor element FET follows any change in the drain current of the amplifying element FET due to temperature changes.

2. A FET bias circuit according to claim 1, wherein:
    said fixed bias circuit applies the bias voltage so that the amplifying element FET enters a predetermined operating class by applying a bias voltage to the monitor element FET in accordance with a detected voltage from the drain current of the monitor element FET and a reference voltage, which is a predetermined direct current voltage.

3. A FET bias circuit according to claim 1, wherein:
    said monitor element FET is thermally bonded and contained in an integrated circuit together with the amplifying element FET so that the drain current follows any change in the drain current of the amplifying element FET due to temperature changes.

4. A FET bias circuit for applying a bias voltage across a gate and a source of an amplifying element FET for amplifying an input high frequency signal, the FET bias circuit comprising:
    a monitor element FET having a gate connected to the gate of the amplifying element FET and a source connected to the source of the amplifying element FET, respectively, and having a drain current with respect to the bias voltage substantially proportional to the drain current of the amplifying element FET; and
    a fixed bias circuit for applying the bias voltage so that the amplifying element FET enters a predetermined operating class by applying a bias voltage to the monitor element FET so that a drain current flowing to the monitor element FET enters a predetermined operating class;
    wherein said fixed bias circuit comprises:
        a first transistor having said detected voltage applied to a base; and
        a second transistor having said reference voltage applied to a base and an emitter voltage of said first transistor applied to an emitter and for outputting a collector current from a collector in accordance with a base-emitter voltage;
    wherein a bias voltage is applied to the monitor element FET in accordance with said collector current so that the bias voltage is applied for placing the amplifying element FET into a predetermined operating class;

wherein said monitor element FET is a GaAs FET produced in a same lot as the amplifying element FET, is thermally bonded and contained in an integrated circuit together with the amplifying element FET, and is such that the drain current of said monitor element FET follows any change in the drain current of the amplifying element FET due to temperature changes.

* * * * *